(12) United States Patent  
Guo

(10) Patent No.: US 7,067,863 B2  
(45) Date of Patent: Jun. 27, 2006

(54) MAGNETIC MEMORY WITH SELF-ALIGNED MAGNETIC KEEPER STRUCTURE

(75) Inventor: Yimin Guo, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 11/167,890

(22) Filed: Jun. 27, 2005

(65) Prior Publication Data

US 2005/0258469 A1 Nov. 24, 2005

Related U.S. Application Data

(62) Division of application No. 10/647,718, filed on Aug. 25, 2003, now Pat. No. 6,927,075.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ..................................... 257/295; 257/421
(58) Field of Classification Search ................ 257/295, 257/421
See application file for complete search history.

(56) References Cited

U.S. PATENT DOCUMENTS

| | | | | |
|---|---|---|---|---|
| 5,569,617 | A * | 10/1996 | Yeh et al. | 438/3 |
| 6,358,757 | B1 | 3/2002 | Anthony | 438/3 |
| 6,413,788 | B1 | 7/2002 | Tuttle | 438/3 |
| 6,417,561 | B1 | 7/2002 | Tuttle | 257/659 |
| 2002/0055190 | A1 | 5/2002 | Anthony | 438/3 |
| 2004/0052131 | A1* | 3/2004 | Komuro et al. | 365/202 |

* cited by examiner

*Primary Examiner*—Phat X. Cao
(74) *Attorney, Agent, or Firm*—Saile Ackerman LLC; Stephen G. Ackerman

(57) ABSTRACT

A magnetic tunneling junction (MTJ) memory cell is formed with a keeper structure on its upper conductor (write line). The keeper structure is formed by a self aligned process as three pieces: two vertical soft magnetic side pieces contacting an upper soft magnetic layer. The structure so formed completely surrounds an upper conductor and terminates on a horizontal extension of the MTJ sense layer.

5 Claims, 4 Drawing Sheets

ମAGNETIC MEMORY WITH
SELF-ALIGNED MAGNETIC KEEPER
STRUCTURE

This is a division of patent application Ser. No. 10/647,718, filing date Aug. 25, 2003, U.S. Pat. 6,927,075, Magnetic with Self-Aligned Keeper Structure, assigned to the same assignee as the present invention, which is herein incorporated by reference in its entirety.

BACKGROUND OF THE INVENTION

1. Field of the Invention

This invention relates to the use of the relative magnetization orientation of sense and reference layers of magnetic tunnel junction (MTJ) devices (cells) to provide a logic storage function for such devices in non-volatile memory cell arrays. In particular it relates to the design and fabrication of cells that include a keeper structure providing a flux closure path to direct demagnetization fields away from the sense layer and thereby improve the thermal stability of the cell.

2. Description of the Related Art

The magnetic tunnel junction (MTJ) basically comprises two layers of ferromagnetic material, a sense layer and a reference layer, separated by a tunnel barrier layer, which is a thin layer of insulating material. The tunnel barrier layer must be sufficiently thin so that there is a probability for charge carriers (typically electrons) to cross the layer by means of quantum mechanical tunneling. The tunneling probability is spin dependent, depending on the orientation of the electron spin relative to the magnetization direction of the ferromagnetic layers. Thus, if these magnetization directions are varied, the tunneling current will also vary as a function of the relative directions for a given applied voltage. As a result of the behavior of an MTJ, sensing the change of tunneling current for a fixed potential can enable a determination of the relative magnetization directions of the two ferromagnetic layers that comprise it. Equivalently, the resistance of the MTJ can be measured, since different relative magnetization directions will produce different resistances.

The use of an MTJ as an information storage device requires that the magnetization of at least one of its ferromagnetic layers, the sense layer, can be varied relative to the other, the reference layer, and also that changes in the relative directions can be sensed by means of variations in the tunneling current or, equivalently, the junction resistance. In its simplest form as a two state memory storage device, the MTJ need only be capable of having its magnetizations put into parallel or antiparallel configurations (writing) and that these two configurations can be sensed by tunneling current variations or resistance variations (reading). In practice, the ferromagnetic sense layer can be modeled as having a magnetization which is free to rotate but which energetically prefers to align in either direction along its easy axis (the direction of magnetic crystalline anisotropy). The magnetization of the reference layer may be thought of as being permanently aligned in its easy axis direction. When the sense layer is anti-aligned with the reference layer, the junction will have its maximum resistance, when they are aligned, the minimum resistance is present. In typical MRAM circuitry, the MTJ devices are located at the intersection of current carrying lines called word lines and bit lines (or word lines and sense lines). When both lines are activated, the device is written upon, ie, its magnetization direction is changed. When only one line is activated, the resistance of the device can be sensed, so the device is effectively read.

As such cells become increasingly small in cross-sectional area and volume, the stability of the magnetization direction of the sense layer is easily affected by random external fields, its self-demagnetizing fields and by thermal effects. One approach to increasing cell stability is to provide the cell with a "keeper" structure, whose role is to provide a flux closure path that directs demagnetization fields away from the cell, thereby enlarging its effective volume. Anthony (U.S. Patent Application Publication No.: US 2002/0055190 A1) provides a keeper structure which is a soft magnetic material surrounding a current carrying conductor beneath the sense layer. The structure thereby provides a mechanism for preventing the formation of demagnetization fields in the edge region of the sense layer above it. Anthony (U.S. Pat. No. 6,358,757 B2) provides a method for forming an array of MRAM devices at the intersections of orthogonally crossing upper and lower conductors in which the lower conductors are surrounded by soft magnetic keeper layers. Tuttle (U.S. Pat. No. 6,413,788 B1), within a variety of embodiments, teaches methods for forming keeper structures around both upper and lower conductors in damascene type trench configurations. In one pertinent embodiment, a tunneling magnetoresistance (TMR) structure (called, by the inventor, the "bit region") is formed between two orthogonally positioned shielded damascene conductor elements. Tuttle (U.S. Pat. No. 6,417,561 B1) also provides a magnetic memory device formed by the methods of the previous cited patent.

A problem arises with the fabrication of such keeper structures in that it is difficult to maintain alignment between the keeper and the sense layer during the fabrication of the cell. Tuttle (in two patents cited above) discloses a keeper structure which is self-aligned with an upper conductor, but the upper conductor is not self-aligned with the cell junction (MTJ). In accord with the method of Tuttle, two separate photo-processes are required to form the device. The purpose of the present invention is to provide a novel design and fabrication methodology which includes the self-aligned formation of the top conductor and its keeper with the MTJ cell. This process provides an effective flux closure for shielding the sense layer of the cell in a manner that will permit the scaling down of cell formation to very high density MRAM formations.

SUMMARY OF THE INVENTION

A first object of this invention is to provide an MTJ memory device having a sense and reference layer and a method of forming a keeper structure for that device to direct demagnetization fields away from its sense layer by containing the flux of said demagnetization fields.

A second object of this invention is to provide such a device and formation method wherein the keeper structure can be formed without misalignment with the sense layer.

A third object of the invention is to provide a method for forming such devices and keeper structures that can be extended to very small dimensions.

These objects will be achieved by a method of forming an MTJ magnetic memory cell configuration having a top keeper structure (a keeper structure formed on its upper conductor or sense line). The fabrication method includes the use of the keeper structure itself as an ion-beam etch mask during fabrication to self-align the sense layer with the keeper structure. This self-aligned method of forming keeper structure comprises a series of process steps that includes a novel patterning of the sense layer to allow the self-aligned formation of the keeper layer. The precise alignments provided by this method will be advantageous in the formation of increasingly smaller memory cells.

BRIEF DESCRIPTION OF THE DRAWINGS

FIG. 1a is a schematic diagram showing a lower conductor (the word line) formed on a substrate in a surrounding insulator layer and sharing a common upper planar surface with the insulating layer.

FIG. 1b is a schematic diagram showing the lower conductor (the surrounding insulator not being shown) on which is formed an initial configuration of the MTJ device (reference layer, tunneling barrier, sense layer and a first capping layer).

FIGS. 1c and 1d are perspective and cross-sectional schematic diagrams showing a patterned four layer configuration comprising an upper conductor (the sense line), an antiferromagnetic layer, soft magnetic layer and a second capping layer, all formed over and transverse to the MTJ device using a photolithographic process.

DESCRIPTION OF THE PREFERRED EMBODIMENT

The preferred embodiment of the invention teaches the formation of an MTJ memory cell having a top keeper structure, ie. a keeper structure formed on an upper conductor (the sense line), the formation process is, thereby, "self-aligned," using the keeper structure itself as a mask to align the keeper with the conductor structure.

Figure 1A:
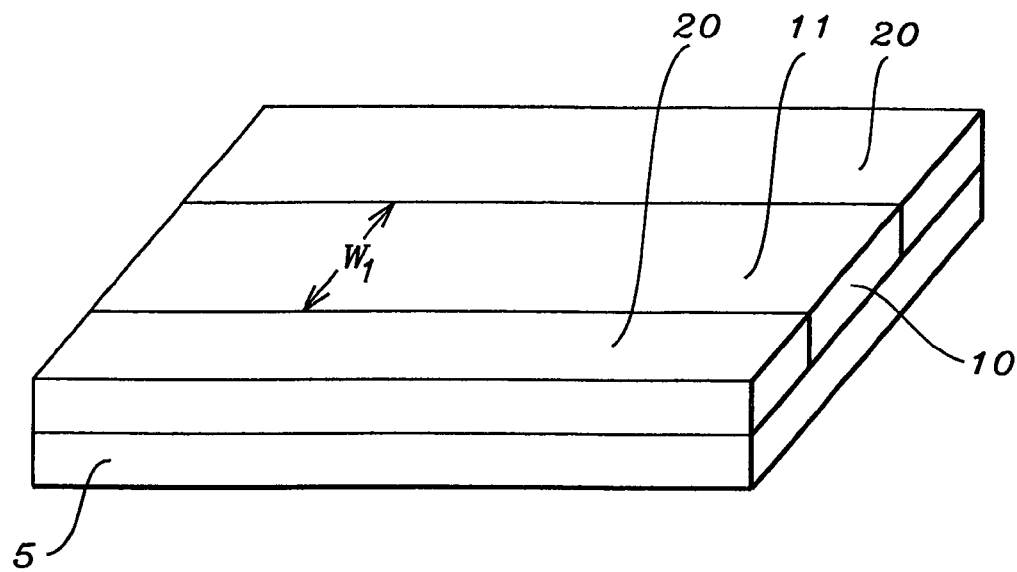
FIGS. 1a–d are schematic illustrations of the process steps required to form the present invention. More specifically.

Referring first to FIG. 1a, there is shown a patterned lower linear conductor layer (the word line) (10) formed with a width $W_1$ on a substrate (5) through any of well known methods such as plating, sputtering or evaporation in conjunction with patterning using a photo mask. The conductor material is preferentially Cu, Al, or a layered structure such as Ta/Au/Ta and said materials are deposited to a thickness between approximately 300 and 10,000 angstroms. An insulator layer is deposited as a blanket layer over the conductor and an upper surface is planarized (by, for example, chemical-mechanical polishing) to form a common planar surface containing an upper conductor surface (11) and surface portions (20) of the insulator layer laterally disposed on either side of the conductor. The present figure shows the conductor and surrounding insulator after the planarization. The following figures will show neither the insulator, as its presence will block the display of structure features, nor the substrate layer.

Figure 1B:
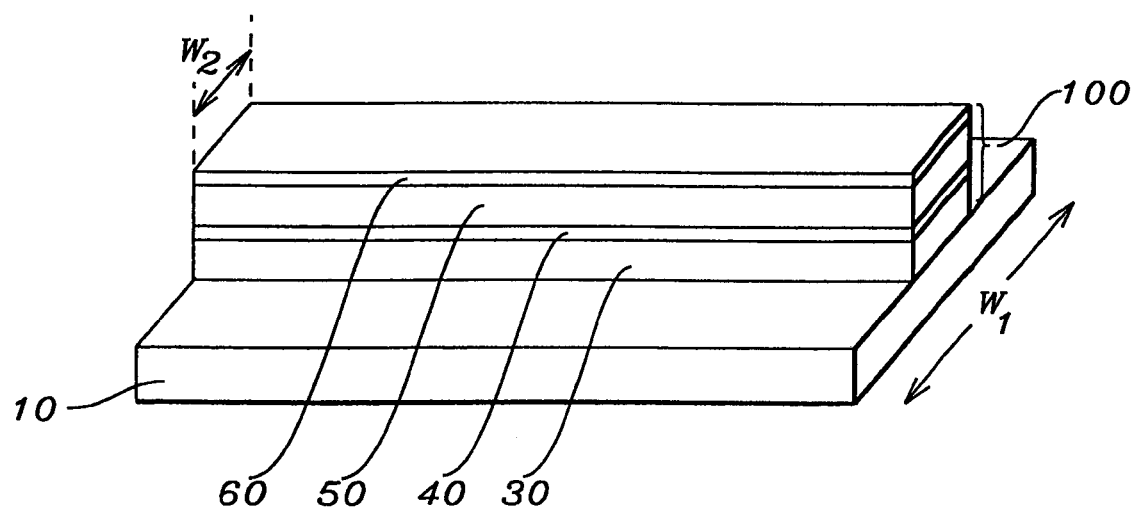

Referring next to FIG. 1b, there is shown, schematically, the planarized lower conductor layer of FIG. 1a (10) upon which a ferromagnetic reference layer (30), an insulating tunneling barrier layer (40), a ferromagnetic sense layer (50) and a first capping layer (60) have been deposited sequentially and patterned to form a layered MTJ stack structure (100) of a common width $W_2$ ($W_2<W_1$) centrally aligned on (10), co-linear with and longitudinally extending along (10). $W_2$ ranges between approximately 0.1 and 1.0 microns and $W_1$ ranges between approximately 0.15 and 2.0 microns. The patterning is accomplished preferentially through photolithographic lift-off processes using reactive-ion etching (RIE) which are known in the art. The reference layer (30) may be a layer of ferromagnetic material such as CoFe, Co, CoFe/NiFe, NiFe, CoFeB or NiFeB formed in thicknesses between approximately 30 and 200 angstroms, or it may be a synthetic exchange coupled antiferromagnetic (SyAF) layer (illustrated schematically in FIG. 2) pinned by an antiferromagnetic (AFM) layer having a structure such as: seed/AFM/CoFe (or Co)/Ru (or Rh)/CoFe (or Co), wherein the seed layer is NiFe, NiFeCr, NiCr, the AFM layer is PtMn, IrMn, FeMn or NiMn and the Ru or Rh layers (providing antiferromagnetic coupling) are formed to a thickness of approximately 7.5 or 5 angstroms respectively. The tunneling barrier layer is preferentially a layer of $Al_2O_3$ or HfO and is formed to a thickness between approximately 5 and 30 angstroms. The capping layer is preferentially a layer of Ta, Ru, TaO, Cu, NiFeCr or NiCr and is formed to a thickness between approximately 10 and 50 angstroms.

Figure 1C:
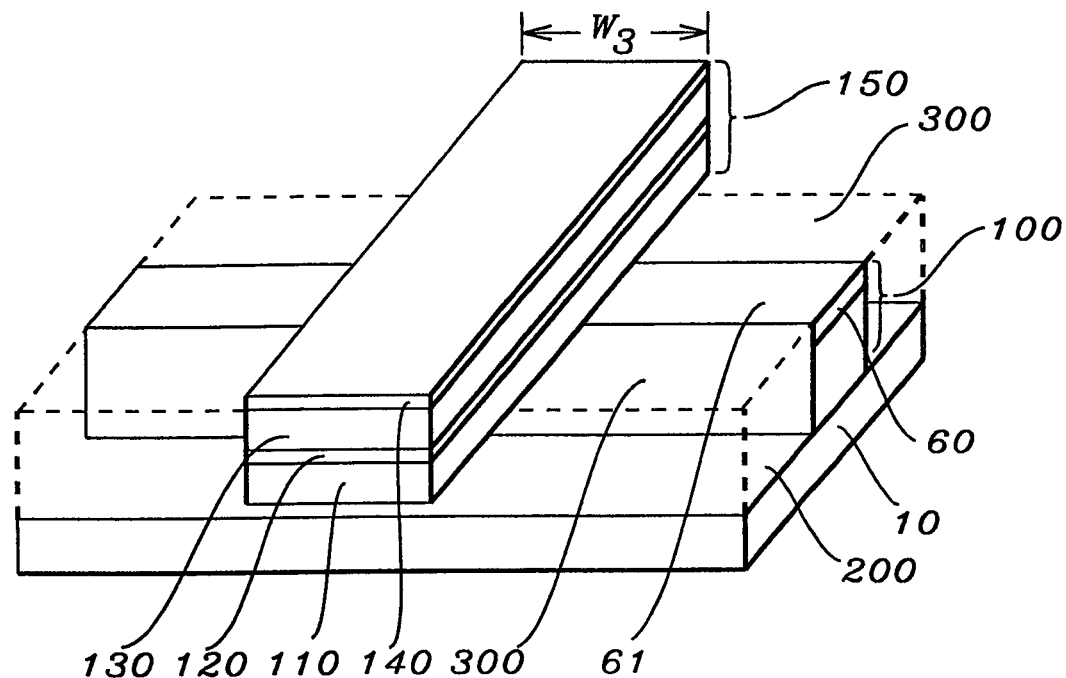
Figure 1D:
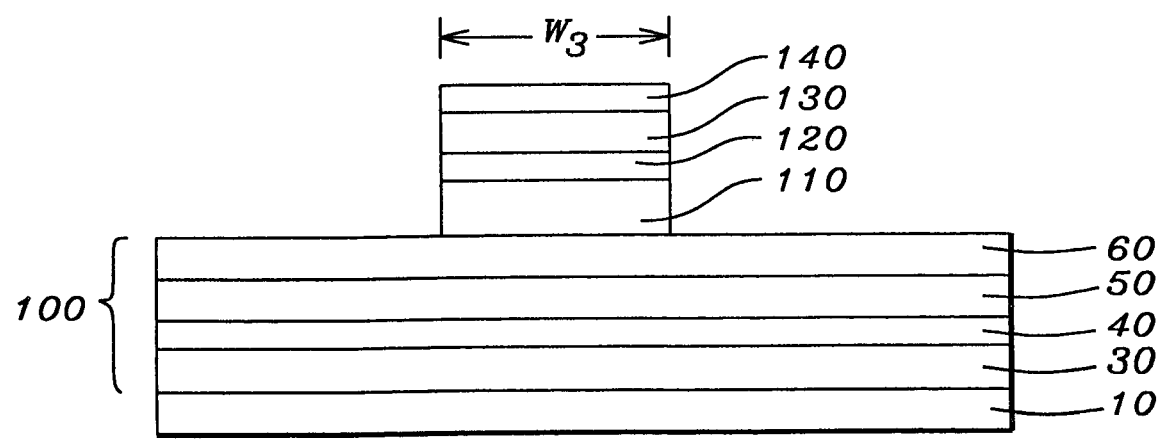

Referring next to both FIGS. 1c and 1d, there is shown, schematically (a perspective view in 1c and a transverse cross-sectional view through the center of the MTJ stack in 1d)), the structure of FIG. 1b upon which the fabrication of an upper conductor with a keeper structure is begun, utilizing the method of the present invention. It will be understood by practitioners in the art that an insulating layer (200), which is partially shown in dashed-outline in FIG. 1c, is first formed over the entire structure of FIG. 1b and is then planarized to create planar upper surfaces (300) which are co-planar with an upper surface (61) of the capping layer (60) of the MTJ junction stack (100). Such a planar surface is required to support the subsequent upper conductor formation, which will now be described.

Referring to either FIG. 1c or 1d, there is seen a patterned, four-layer, upper linear conductor structure (150) on which a keeper structure has not yet been fully formed. This structure comprises an upper conductor layer (the sense line) (110), and additional layers that will form the keeper structure: an optional antiferromagnetic (AFM) layer (120), a soft magnetic layer (130) and a capping layer (140). The patterned structure is transverse to the MTJ stack (100). This patterned conductor structure is formed by sequential layer depositions using chemical vapor deposition (CVD) or ion beam deposition (IBD), the depositions being followed by photolithographic patterning using a lift-off mask and etch process. The specific photolithographic patterning process is not shown.

The layers ((110), (120), (130) and (140) are all formed sequentially by ion-beam deposition (IBD) or chemical vapor deposition. Following deposition, the layers are patterned by a photolithographic lift-off process (not shown) to achieve a linear form, having substantially vertical sides separated by a width $W_3$ (substantially equal to $W_2$) as shown in the figure, and the photolithographic mask is then removed. FIG. 1c shows the formation subsequent to mask removal. Note that the upper surface (61) of capping layer (60) is exposed by removal of the mask. Also note that the structure (150) is transverse to the MTJ stack and contacts it at the upper surface (61).

As is also seen in the figure, the layers ((110), (120), (130) and (140)) are contiguous and coextensive with each other and the first layer in the keeper structure (the AFM layer, if used, or the soft magnetic layer if the AFM layer is omitted) is coextensive with the upper conductor layer (110). The optional AFM layer is preferentially formed of IrMn to a thickness between approximately 30 and 100 angstroms and it may be used to provide an exchange field along the longitudinal direction of the patterned layered structure. The soft magnetic layer is preferentially a layer of CoFe, NiFe or NiFeCo formed to a thickness between approximately 50 and 500 angstroms. The second capping layer (140) is preferentially a layer of Ta, Ru, TaO, Cu, NiFeCr, or NiCr and it is formed to a thickness between approximately 10 and 1000 angstroms. The as-deposited structure ((100), (120), (130) and (140)) is shown both in perspective and in a cross-sectional view taken through a longitudinal plane bisecting the lower conductor and MTJ structure (FIGS. 1c and 1d (respectively)).

Figure 1E:
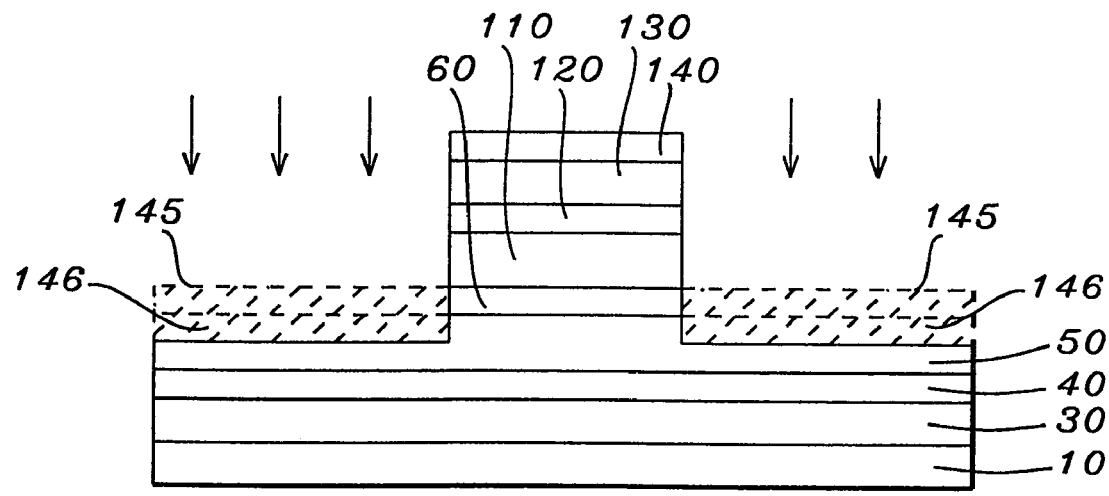
FIG. 1e is a schematic diagram showing a patterning by ion-beam etch to remove a portion of the sense layer.

Referring next to FIG. 1e, there is shown a schematic cross-sectional view of the fabrication as shown in FIG. 1c, or 1d, subsequent to a first ion-beam etching. The etching process (arrows), which is done subsequent to the removal of the photoresist mask used in the deposition processes described in FIG. 1c, removes two side portions (145) of the first capping layer (60) (shown as shaded regions with broken-line boundaries) which are not covered by the upper conductor layer (110) and are laterally disposed to (110). The same etch also partially removes an upper portion (146) of the sense layer (50) of the MTJ (also shown shaded and with broken-line boundaries) which is beneath (145).

Figure 1F:
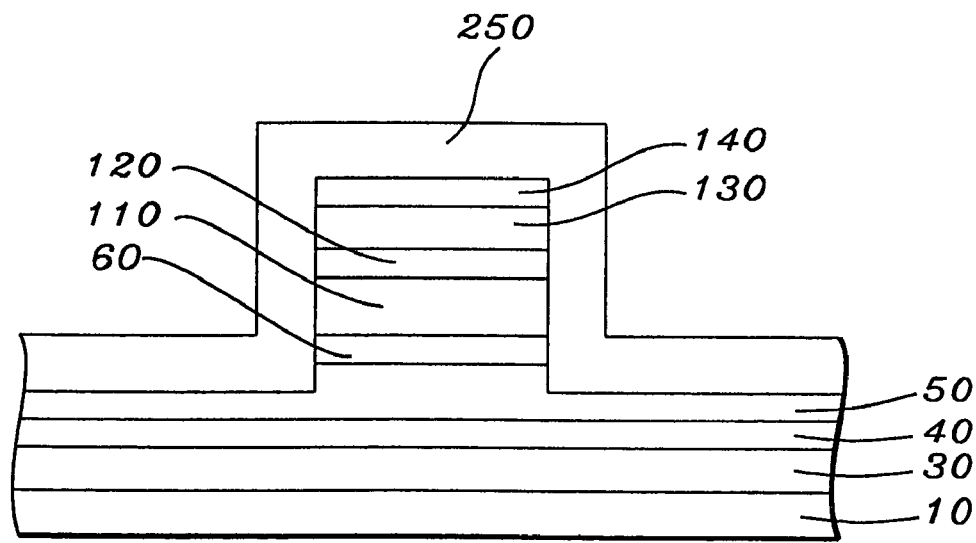
FIG. 1f is a schematic diagram showing a soft magnetic layer deposited by chemical vapor deposition (CVD) over the fabrication of FIG. 1e.

Referring next to FIG. 1f, there is shown a schematic cross-sectional view of the fabrication in FIG. 1d wherein a layer of soft magnetic material (250) such as NiFe, CoFe, NiFeCo is preferentially deposited by chemical vapor deposition (CVD) to a thickness between approximately 50 and 1000 angstroms to cover all horizontal and vertical exposed surfaces of said fabrication. As is seen in the figure, layer (250) contacts the upper surface of capping layer (140) as well as the partially etched upper surface of sense layer (50) and the lateral sides of layers (50), (60), (110), (120), (130) and (140).

Figure 1G:
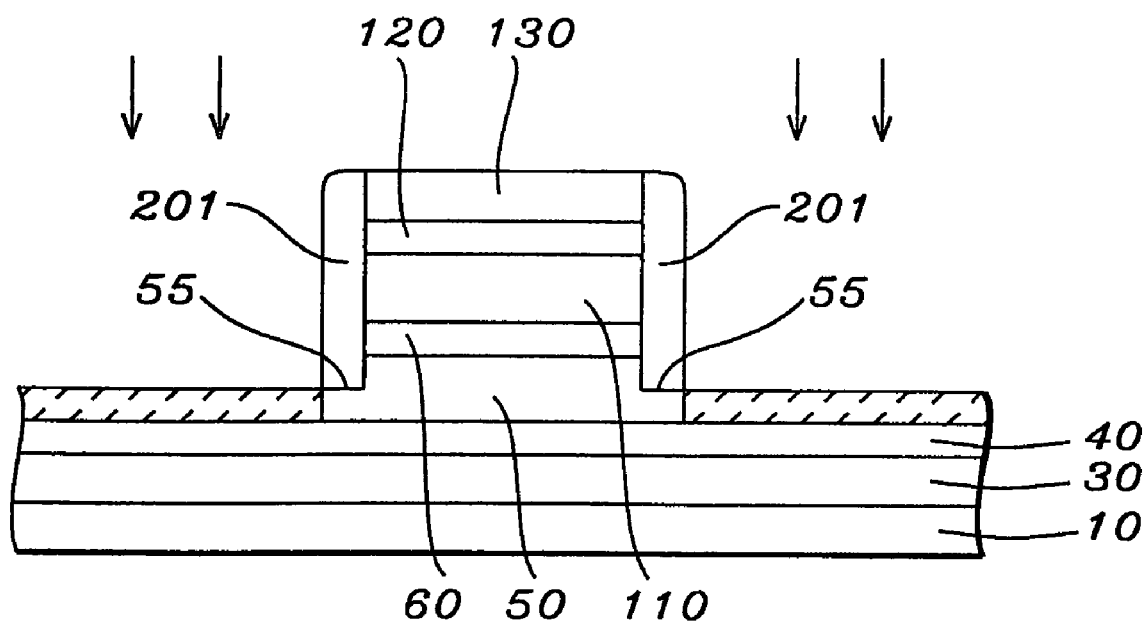
FIG. 1g is a schematic diagram showing the results of a second ion-beam etch to remove lateral portions of the soft magnetic layer and the sense layer beneath it and complete the keeper structure.

Referring next to FIG. 1g, there is shown, schematically, the fabrication of FIG. 1e wherein a second ion-beam etch (arrows), guided and aligned by the layer (200), has been applied vertically to remove laterally disposed portions of sense layer (50), the removed portions being shown outlined in broken lines and shading (57). The ion-beam etch also removes all portions of the second soft magnetic material layer ((200) in FIG. 1e) except for vertical side portions (201) which remain as shown contacting the sides of the sense layer (50) (partially) and terminating on horizontal projections (55) of the sense layer produced by the first ion-beam etch, the first capping layer (60), the upper conductor (110), the optional AFM layer (120) and the first soft magnetic layer (130). Advantageously, the etch is aligned by the edges of the vertical portions of the second magnetic layer (200). The etch has also removed the second capping layer ((140) in FIG. 1c), but the soft magnetic layer (130) remains. The keeper structure of the present invention is seen to be the soft magnetic formation comprising the side pieces (201) formed of soft magnetic material, and the soft magnetic layer (130).

Figure 2:
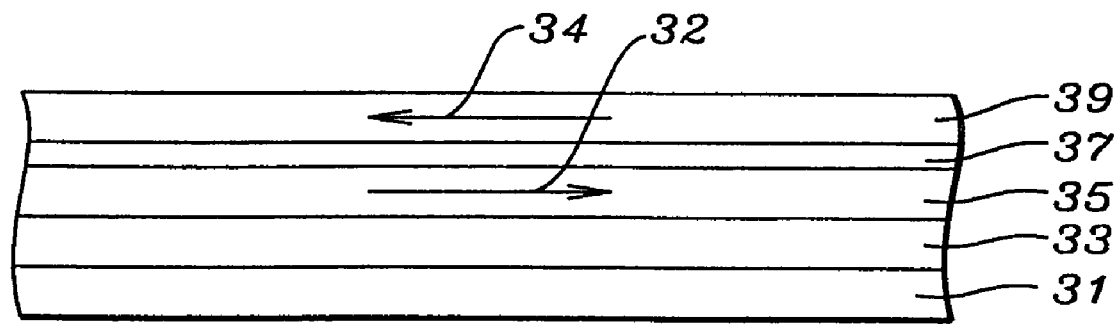
FIG. 2 shows a preferred embodiment of a reference layer which is a pinned synthetic antiferromagnetic layer.

Referring finally to FIG. 2, there is seen a schematic cross-sectional view of an isolated magnetized synthetic antiferromagnetic (SyAF) reference layer, which is mentioned as a preferred structure in the discussion of FIG. 1b.

The SyAF layer of FIG. 2 would correspond to layer (30) of FIG. 1b. The SyAF includes a seed layer (31) suitable for the growth of a layer of antiferromagnetic material (AFM). On the seed layer there is an AFM layer (33) which will serve as a pinning layer. On the AFM pinning layer there is formed a tri-layer comprising a first ferromagnetic layer (35), an antiferromagnetically coupling layer (37) and a second ferromagnetic layer (39). The first and second ferromagnetic layers are magnetized in opposite directions (arrows (32) and (34)), the magnetization being rendered energetically favorable by exchange coupling across the coupling layer and being held in place by the pinning layer. In this preferred embodiment, the two ferromagnetic layers are layers of CoFe or Co and are formed to thicknesses between approximately 10 and 40 angstroms. The coupling layer (37) is a layer of Ru of thickness between approximately 7 and 8 angstroms, with 7.5 angstroms being preferred or a layer of Rh of thickness between approximately 4.5 and 5.5 angstroms with approximately 5 angstroms being preferred. The AFM layer (33) is a layer of MnPt or NiMn of thickness between approximately 80 and 300 angstroms and the seed layer is a layer of NiFeCr, NiCr or NiFe of thickness between approximately 20 and 50 angstroms. A SyAF reference layer such as this generates a very strong magnetic pinning force on the sense layer.

As is understood by a person skilled in the art, the preferred embodiment of the present invention is illustrative of the present invention rather than being limiting of the present invention. Revisions and modifications may be made to methods, processes, materials, structures, and dimensions through which is formed a magnetic memory cell having a top keeper structure, while still providing a magnetic memory cell having a top keeper structure, formed in accord with the present invention as defined by the appended claims.

What is claimed is:

1. An MTJ memory device including an upper conductor with a keeper structure comprising:
   a substrate;
   an insulating layer formed on said substrate, a lower conductor layer being formed in said insulating layer and the upper surfaces of said insulating layer and said conductor being co-planar;
   an MTJ stack formed, co-linearly and centrally, on said lower conductor, said stack including a sense layer;
   an insulating layer formed, laterally disposed to both sides of said stack, the upper surfaces of said layer and the upper surface of said stack forming a common plane;
   a horizontally layered upper conductor formed orthogonally to and contacting said MTJ stack on said plane, said upper conductor having planar vertical sides and the upper layer of said conductor being a layer of soft magnetic material;
   a keeper structure formed on said upper conductor, said structure comprising said upper soft magnetic layer contacted on laterally opposite edges by an upper portion of vertical soft magnetic side pieces formed on said planar vertical sides, a lower portion of said vertical side pieces contacting sides of a sense layer and terminating on lateral extensions of said sense layer.

2. The device of claim 1 wherein said soft magnetic layer is a layer of CoFe, NiFe or NiFeCo formed to a thickness between approximately 50 and 500 angstroms.

3. The device of claim 1 wherein said vertical side pieces are formed of the soft magnetic material NiFe, CoFe or NiFeCo to a thickness between approximately 50 and 1000 angstroms.

4. The device of claim 1 wherein said keeper structure includes a layer of antiferromagnetic material formed between said upper soft magnetic layer and said upper conductor.

5. The device of claim 4 wherein said layer of antiferromagnetic material is a layer of IrMn formed to a thickness between approximately 30 and 100 angstroms.

* * * * *